(12) United States Patent
Lee et al.

(10) Patent No.: US 10,551,979 B2
(45) Date of Patent: Feb. 4, 2020

(54) TOUCH DISPLAY DEVICE

(71) Applicant: LG Display Co., Ltd., Seoul (KR)

(72) Inventors: Yangsik Lee, Paju-si (KR); Jae Gyun Lee, Paju-si (KR); Deuk Su Lee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 90 days.

(21) Appl. No.: 15/851,220

(22) Filed: Dec. 21, 2017

(65) Prior Publication Data
US 2018/0348907 A1 Dec. 6, 2018

(30) Foreign Application Priority Data
Jun. 1, 2017 (KR) .......................... 10-2017-0068245

(51) Int. Cl.
*G06F 3/044* (2006.01)
*G06F 3/041* (2006.01)

(52) U.S. Cl.
CPC ............ *G06F 3/044* (2013.01); *G06F 3/0412* (2013.01); *G06F 2203/04112* (2013.01); *G09G 2310/0264* (2013.01)

(58) Field of Classification Search
CPC ......... G06F 2203/04112; G06F 3/0412; G06F 3/044; G09G 2310/0264; H01L 27/323
USPC .................................................. 345/170–178
See application file for complete search history.

(56) References Cited

U.S. PATENT DOCUMENTS

| | | | |
|---|---|---|---|
| 2009/0262095 A1 | 10/2009 | Kinoshita et al. | |
| 2010/0007624 A1* | 1/2010 | Jiang | G06F 3/0414 345/173 |
| 2010/0110041 A1 | 5/2010 | Jang | |
| 2011/0048914 A1* | 3/2011 | Hsu | G06F 3/044 200/600 |
| 2011/0216018 A1 | 9/2011 | Kim et al. | |
| 2013/0106747 A1* | 5/2013 | Choi | G06F 3/041 345/173 |
| 2013/0229379 A1* | 9/2013 | Joguet | G06F 3/045 345/173 |
| 2013/0293791 A1 | 11/2013 | Abe et al. | |
| 2014/0292710 A1 | 10/2014 | Koito et al. | |
| 2017/0344147 A1 | 11/2017 | Weng et al. | |

FOREIGN PATENT DOCUMENTS

| | | |
|---|---|---|
| CN | 105373275 A | 3/2016 |
| CN | 106155444 A | 11/2016 |
| JP | 2009-258935 A | 11/2009 |

(Continued)

OTHER PUBLICATIONS

Japanese Office Action dated Jan. 22, 2019, for Application No. 2017-248941, 10 pages. (With Machine Translation).

*Primary Examiner* — Tony O Davis
(74) *Attorney, Agent, or Firm* — Seed IP Law Group LLP

(57) ABSTRACT

A touch display device and a touch display panel. Touch lines and contact pads are disposed between touch electrodes, arranged in touch electrode lines in the touch display panel, and a driver circuit. A total of the area of each touch line and the area of the corresponding contact pad has a predetermined value. Differences in parasitic capacitance among the touch lines according to the positions of the touch electrodes are compensated for. It is possible to prevent the accuracy of sensing from being lowered by differences in parasitic capacitance among the touch electrodes disposed in different positions.

21 Claims, 8 Drawing Sheets

(56) References Cited

FOREIGN PATENT DOCUMENTS

| JP | 3198981 U | 7/2015 |
|----|-----------|--------|
| KR | 10-2013-0101862 A | 9/2013 |
| KR | 10-2015-0092523 A | 8/2015 |
| TW | 201346691 A | 11/2013 |
| TW | I584177 B | 5/2017 |
| WO | 2015/137643 A1 | 9/2015 |
| WO | 2016/039047 A1 | 3/2016 |

* cited by examiner

TOUCH DISPLAY DEVICE

CROSS REFERENCE TO RELATED APPLICATION

This application claims priority from Korean Patent Application No. 10-2017-0068245, filed on Jun. 1, 2017, which is hereby incorporated by reference in its entirety for all purposes as if fully set forth herein.

BACKGROUND

Technical Field

Example embodiments relate to a display device, and more particularly, to a touch display device that can sense a touch on a display panel.

Description of the Related Art

In response to the development of the information society, there has been increasing demand for display devices able to display images. Recently, a range of display devices, such as liquid crystal display (LCD) devices, plasma display panels (PDPs), and organic light-emitting display devices, have come into widespread use.

Such display devices provide a touch-based input interface, recognizing a user's touch on a display panel and performing input processing, based on the recognized touch, to provide a wider range of functions to users.

As an example, a plurality of touch electrodes to detect a user's touch on a display panel and touch interconnects to connect the touch electrodes to a driving circuit are disposed on the display panel. Accordingly, the user's touching state, positions of the display panel, or the like, may be detected by sensing a change in capacitance occurring during the user's touch on the display panel.

Such a touch sensing method, based on the sensing of a change in capacitance, may be influenced by parasitic capacitance occurring in the display panel. In particular, since touch lines connecting the touch electrodes and the driver circuit have different lengths, according to positions in which the touch electrodes are disposed, differences in capacitance among the touch lines may lower the accuracy of touch sensing, which is problematic.

BRIEF SUMMARY

Various aspects of the present disclosure provide a touch display device that can reduce differences in parasitic capacitance occurring in a touch display panel, thereby preventing the accuracy of touch sensing from being lowered by parasitic capacitance.

Also provided is a touch display device that can reduce differences in parasitic capacitance, caused by components disposed between touch electrodes and a driver circuit, using touch lines through which the touch electrodes are connected to the driver circuit.

According to an aspect of the present disclosure, a touch display device may include: a first contact pad connected to a first touch electrode among touch electrodes arranged in a first touch electrode line in a touch display panel; a first touch line connected to the first contact pad; a second contact pad connected to a first touch electrode among touch electrodes arranged in a second touch electrode line in the touch display panel; and a second touch line connected to the second contact pad.

A value obtained by adding a product of a width and length of the first contact pad to a product of a width and length of the first touch line may be the same as a value obtained by adding a product of a width and length of the second contact pad to a product of a width and length of the second touch line.

According to another aspect of the present disclosure, a touch display device may include: a plurality of touch electrodes arranged in touch electrode lines in a touch display panel; a plurality of contact pads connected to outermost touch electrodes in the touch electrode lines among the plurality of touch electrodes, respectively; and a plurality of touch lines connected to the plurality of contact pads, respectively. A product of a width and a length of each of the plurality of contact pads may be proportional to a width of a touch line connected thereto, among the plurality of touch lines, and may be inverse proportional to a length of the touch line connected thereto.

According to an aspect of the present disclosure, a touch display device may include: a first contact pad connected to a first touch electrode among touch electrodes arranged in a first touch electrode line in a touch display panel; a first touch line connected to the first contact pad; a second contact pad connected to a first touch electrode among touch electrodes arranged in a second touch electrode line in the touch display panel; and a second touch line connected to the second contact pad. A thickness of an encapsulation layer disposed below the first contact pad and the first touch line is a first thickness, and a thickness of an encapsulation layer disposed below the second contact pad and the second touch line is a second thickness.

A value obtained by dividing a total of a product of a width and a length of the first contact pad and a product of a width and a length of the first touch line with the first thickness may be the same as a value obtained by dividing a total of a product of a width and length of the second contact pad and a product of a width and length of the second touch line with the second thickness.

According to the present disclosure, the touch lines and the contact pads connected to the touch electrodes are designed differently according to the connected touch electrodes, such that differences in parasitic capacitance, according to positions in which the touch electrodes are disposed can be reduced, thereby improving the accuracy of touch sensing.

In addition, according to the present disclosure, differences in parasitic capacitance are reduced in consideration of the touch lines and the contact pads disposed between the touch electrodes and the driver circuit, such that differences in parasitic capacitance according to positions in which the touch electrodes are disposed can be accurately compensated for.

BRIEF DESCRIPTION OF THE SEVERAL VIEWS OF THE DRAWINGS

The above and other objects, features and advantages of the present disclosure will be more clearly understood from the following detailed description when taken in conjunction with the accompanying drawings, in which.

DETAILED DESCRIPTION

Figure 1:
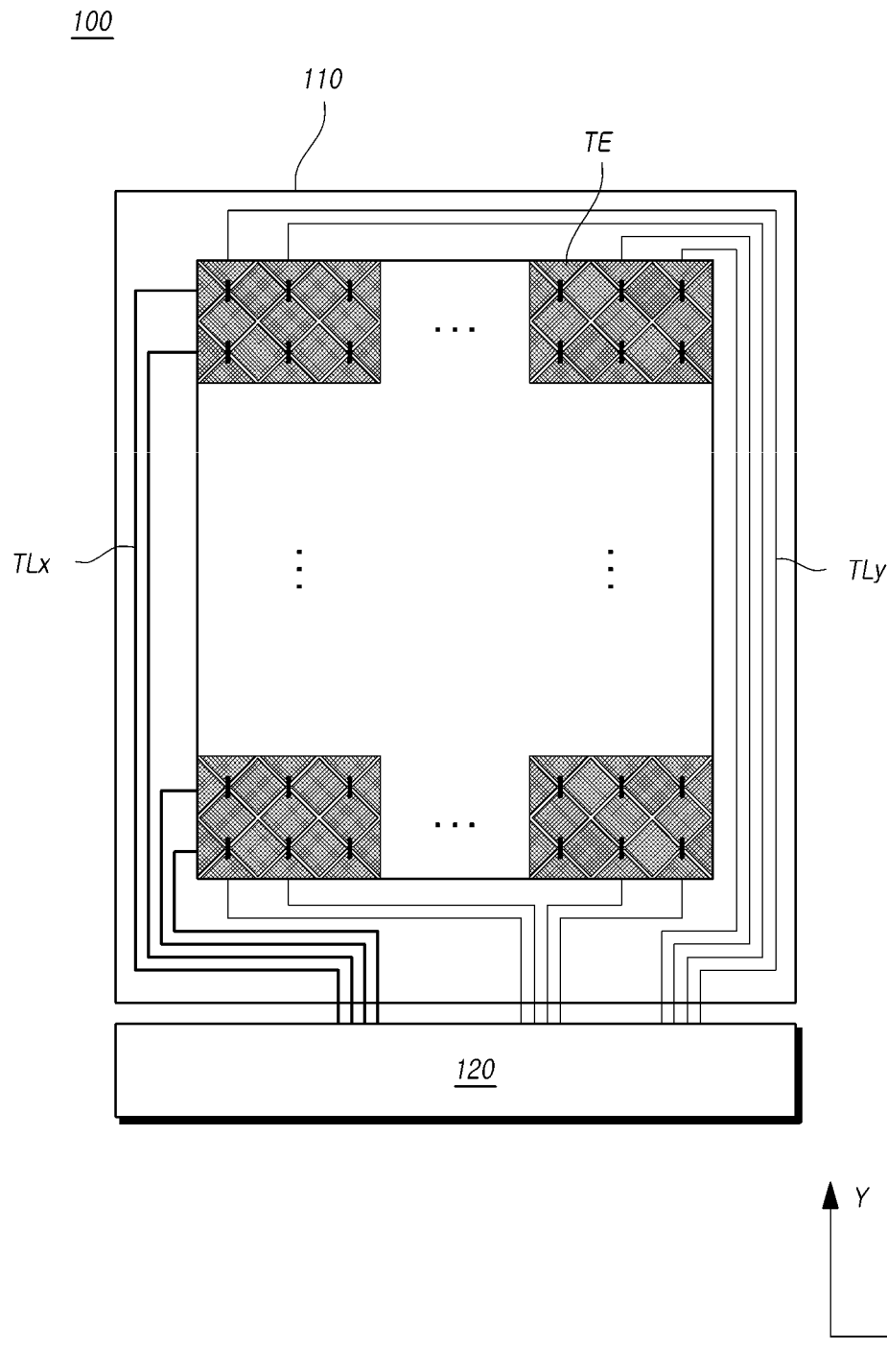
FIG. 1 illustrates a schematic configuration of a touch display device according to example embodiments.

Hereinafter, reference will be made to embodiments of the present disclosure in detail, examples of which are illustrated in the accompanying drawings. Throughout this document, reference should be made to the drawings, in which the same reference numerals and symbols will be used to designate the same or like components. In the following description of the present disclosure, detailed descriptions of known functions and components incorporated herein will be omitted in the case that the subject matter of the present disclosure may be rendered unclear thereby.

It will also be understood that, while terms such as "first," "second," "A," "B," "(a)," and "(b)" may be used herein to describe various elements, such terms are merely used to distinguish one element from another element. The substance, sequence, order, or number of these elements is not limited by these terms. It will be understood that when an element is referred to as being "connected to" or "coupled to" another element, not only can it be "directly connected or coupled to" the other element, but it can also be "indirectly connected or coupled to" the other element via an "intervening" element. In the same context, it will be understood that when an element is referred to as being formed "on" or "under" another element, not only can it be directly formed on or under another element, but it can also be indirectly formed on or under another element via an intervening element.

FIG. 1 illustrates a schematic configuration of a touch display device 100 according to example embodiments.

Referring to FIG. 1, the touch display device 100 according to example embodiments includes a touch display panel 110 in which a plurality of touch electrodes TE and a plurality of touch lines TL are disposed and a driver circuit 120 driving the touch electrodes TE disposed in the touch display panel 110 and performing touch sensing.

The plurality of touch electrodes TE include transmission (Tx) electrodes to which touch driving signals are applied and receiving (Rx) electrodes for receiving touch sensing signals in the case in which mutual-capacitance-based touch sensing is performed. The plurality of touch electrodes TE, disposed in the display panel 110, have a predetermined size and are separated from each other.

The plurality of touch lines TL include touch lines TL connected to the Tx electrodes to receive touch driving signals applied thereto and touch lines TL connected to the Rx electrodes to transfer touch sensing signals.

For example, the touch lines TL to which touch driving signals are applied are connected to the touch electrodes TE disposed in the touch display panel 110 in a row direction, i.e., in the X-axial direction, shown as TLx, while the touch lines TL transferring touch sensing signals are connected to the touch electrodes TE disposed in the touch display panel 110 in a column direction, i.e., the Y-axial direction, shown as TLy. However, the present disclosure is not limited thereto.

The driver circuit 120 includes a data driver circuit outputting signals for display driving of the touch display panel 110 and a touch driving circuit performing touch sensing using the touch electrodes TE.

The data driver circuit allows an image to be displayed on the display panel 110 by outputting data voltages based on the grayscales of image data at a point in time at which scanning signals are applied to subpixels defined in the touch display panel 110.

The touch driving circuit senses a touch on the display panel 110 by applying touch driving signals to the touch electrodes TE through the touch lines TL disposed in the touch display panel 110 and receiving touch sensing signals.

The touch display device 100 may be a liquid crystal display (LCD) device or an organic light-emitting display device.

In the case in which the touch display device 100 is an LCD device, common electrodes disposed in the display panel 110 for display driving can be used as the touch electrodes TE. In the case in which the touch display device 100 is an organic light-emitting display device, touch sensing can be performed using the touch electrodes TE disposed on an encapsulation layer in the touch display panel 110.

Figure 2:
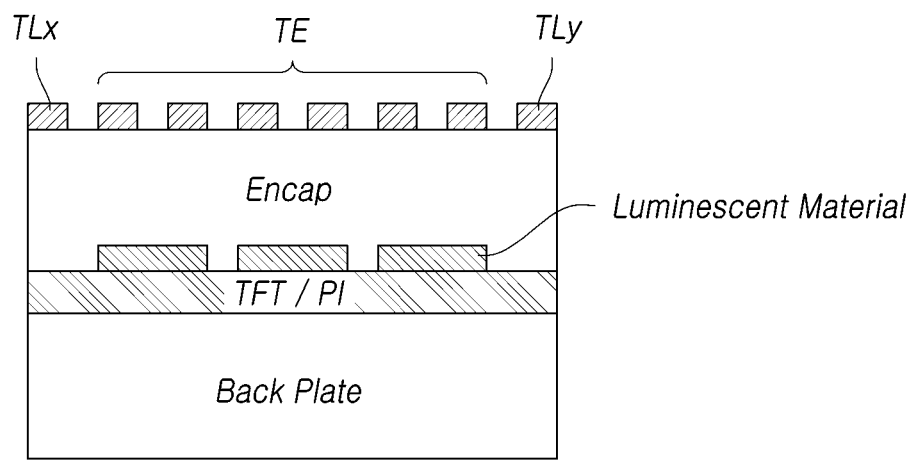
FIGS. 2 to 4 illustrate cross-sectional views of the touch display device according to example embodiments.

FIG. 2 illustrates a cross-section of the touch display device 100 according to example embodiments in the case in which the touch display device 100 is an organic light-emitting display device.

Referring to FIG. 2, in the touch display device 100 according to example embodiments, a thin-film transistor (TFT) layer is disposed on a substrate or a back plate. Here, polyimide (PI), as well as TFTs for display driving, is provided on the TFT layer.

An anode is disposed on a light-emitting position of each of the subpixels on the TFT layer, an organic light-emitting layer and a bank are disposed on the anode, and a cathode is commonly disposed in the areas of the subpixels.

An encapsulation layer Encap is disposed on the cathode, and a touch sensing configuration, including the plurality of touch electrodes TE and the touch lines TL, is disposed on the encapsulation layer Encap.

The touch electrodes TE are formed of a metal that can be disposed on the encapsulation layer Encap. In this case, the touch electrodes TE and the touch display panel 110 may be integrated with one another.

Alternatively or additionally, the touch electrodes TE may be a film touch sensor attached to the top surface of the encapsulation layer Encap via an adhesive film OCA. That is, the touch electrodes TE may be formed by attaching separate a film touch sensor to the touch display panel 110.

Thus, a variety of methods of disposing the touch electrodes TE on the encapsulation layer Encap may be selected according to processing advantages. In addition to the above-described examples, any structures in which the electrodes TE are located on the encapsulation layer Encap may be embraced within the scope of example embodiments.

An example structure in which the touch electrodes TE are disposed on the encapsulation layer Encap will be described with reference to FIGS. 3 and 4.

Figure 3:
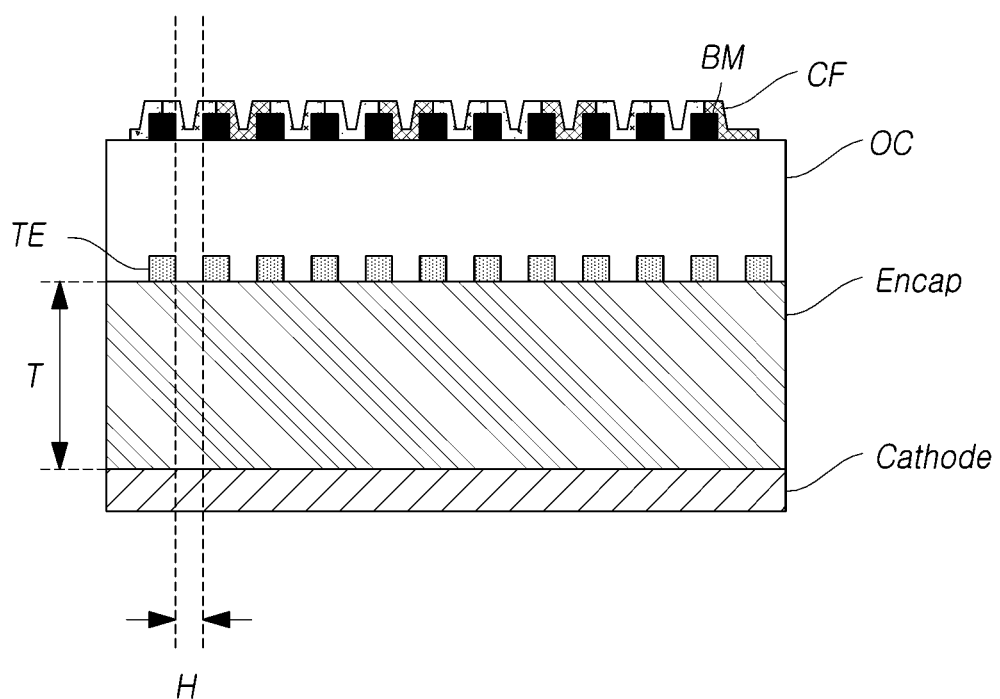
Figure 4:
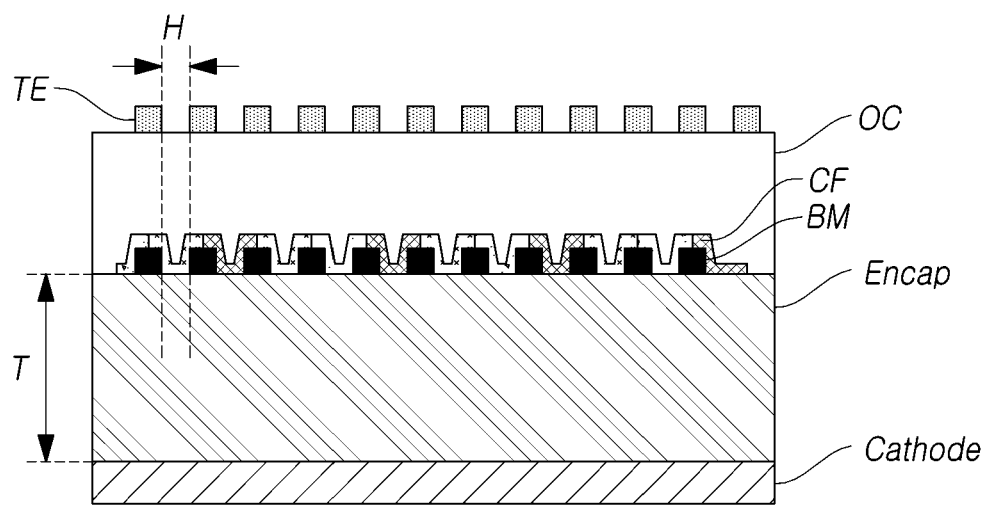

Referring to FIGS. 3 and 4, the touch electrodes TE are disposed between the encapsulation layer Encap and the touch display panel 110. That is, the touch sensing configuration, including the touch electrodes TE and the touch lines TL, is disposed on the encapsulation layer Encap.

The thickness of the encapsulation layer Encap may be 5 μm or more.

In the case in which the thickness T of the encapsulation layer Encap is designed to be a predetermined thickness or more, parasitic capacitance formed between the cathode of the OLED and the touch electrode TE can be reduced. This can consequently prevent the sensitivity of touch sensing from being lowered by parasitic capacitance.

In the case in which the touch electrodes TE may be mesh-type electrodes respectively having holes H, the holes H of the touch electrodes TE may be located in positions corresponding to light-emitting portions of the subpixels.

Thus, the holes H of the touch electrodes TE may correspond to the color filters CF. In the case in which the color filters CF are required as in the case in which white OLEDs are used, the positions of the color filters CF can be matched to the positions of the holes H of the touch electrodes TE. With this configuration, the touch display device 100 can have superior luminous performance.

The top-bottom positional relationships between the touch electrodes TE and the color filters CR can be variously designed.

In an example, as illustrated in FIG. 3, the color filters CF and the black matrices BM are disposed above the touch electrodes TE. Specifically, the color filters CF and the black matrices BM are disposed on the overcoat OC covering the touch electrodes TE.

In another example, as illustrated in FIG. 4, the color filters CF and the black matrices BM are located below the touch electrodes TE. Here, the touch electrodes TE are disposed on the overcoat OC covering the color filters CR and the black matrices BM.

That is, the touch electrodes TE and the color filters CF can be designed variously to have the optimal positional relationship, in consideration of touch performance and displaying performance.

In addition, due to the structure having the touch electrodes TE disposed on the encapsulation layer Encap, it is possible to overcome the problem that makes it difficult to form the touch electrodes TE, typically made of a metal, within the panel and to provide an organic light-emitting display device having superior displaying performance and touch performance.

The touch lines TL are arranged in the peripheral areas of the display panel 110 to apply touch driving signals to the touch electrodes TE disposed in the touch display panel 110 and to receive touch sensing signals from the touch electrodes TE.

The lengths of the touch lines TL, arranged in the peripheral areas of the touch display panel 110, are different depending on the positions of the touch electrodes TE to which the touch lines TL are connected. In the event of capacitance-based touch sensing using the touch electrodes TE, different levels of parasitic capacitance may be formed.

Figure 5:
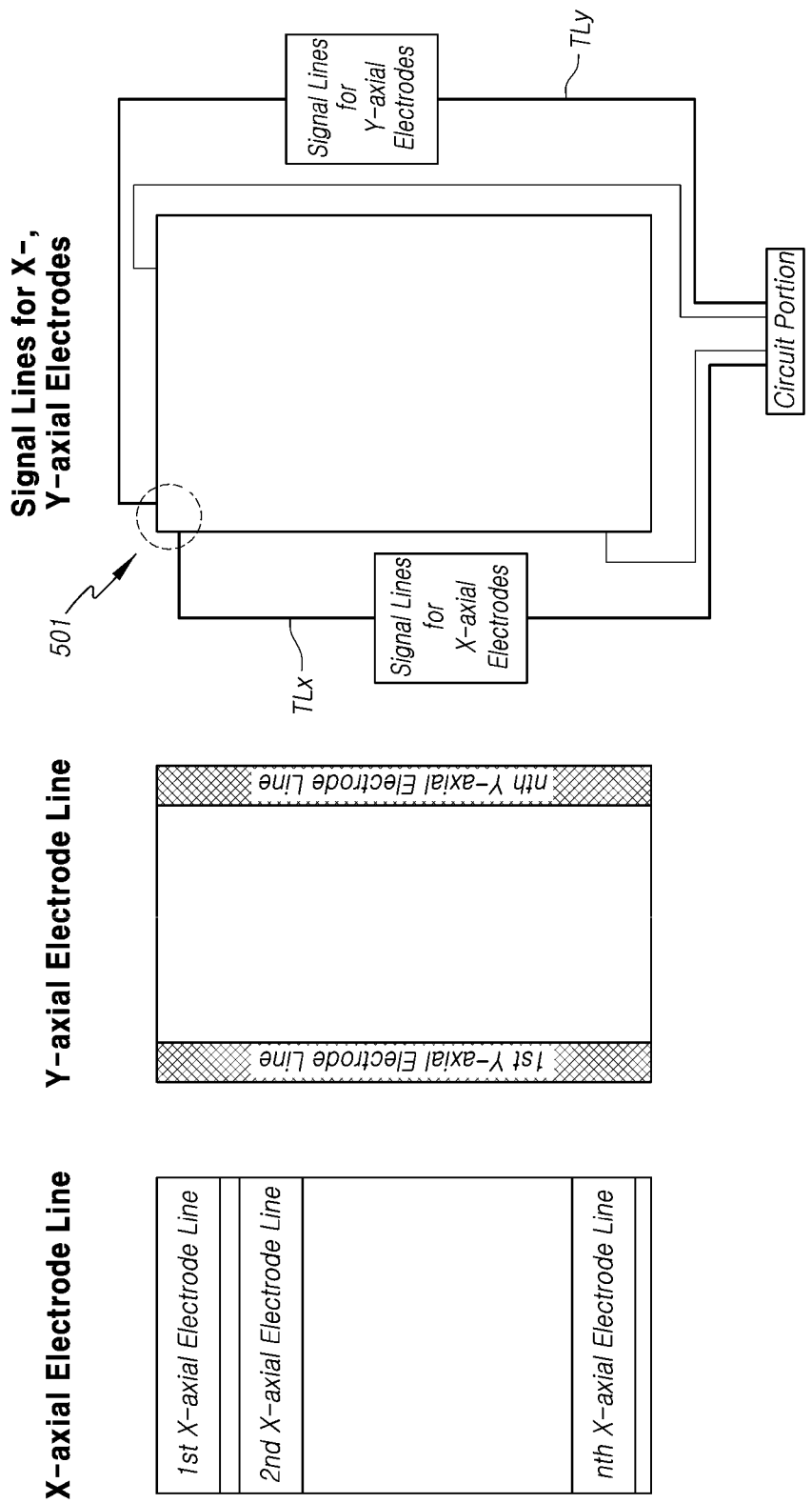
FIG. 5 illustrates differences in parasitic capacitance depending on the positions of touch electrodes in the touch display device.

FIG. 5 illustrates differences in parasitic capacitance depending on the positions of the touch electrodes TL in the touch display device 100.

Referring to FIG. 5, in the touch display panel 110 of the touch display device 100 according to example embodiments, X-axial electrode lines are arranged in the X-axial direction.

The touch electrodes TE in the X-axial electrode lines are connected to the driver circuit 120 via the touch lines TLx.

In the touch display panel 110, Y-axial electrode lines are arranged in the Y-axial direction. The Y-axial electrode lines are lines of touch electrodes TE, i.e., Rx electrodes, for receiving touch sensing signals in the event of touch sensing.

In the Y-axial electrode lines, the touch electrodes TE, arranged in the Y-axial direction, are connected to the driver circuit 120 via the touch lines TLy.

The touch lines TL (TLx, TLy) are arranged in the peripheral areas of the touch display panel 110 to connect the touch electrodes TE to the driver circuit 120.

For example, the touch lines TL connected to the X-axial electrode lines extend from the circuit portion of the driver circuit 120, in the left peripheral area of the touch display panel 110, and are connected to the X-axial electrode lines, respectively, in the left peripheral area.

Thus, the touch line TL, connected to the first X-axial electrode line arranged in a position spaced apart from an area in which the circuit portion of the driver circuit 120 is disposed, is longer than the touch line TL, connected to the $n^{th}$ X-axial electrode line arranged adjacently to the circuit portion of the driver circuit 120.

For example, the touch lines TL connected to the Y-axial electrode lines extend from the circuit portion of the driver circuit 120, in the right peripheral area and the top peripheral area of the touch display panel 110, and are connected to the Y-axial electrode lines, respectively, e.g., in the top peripheral area.

Thus, the touch line TL, connected to the Y-axial electrode line arranged in the left portion of the touch display panel 110, is longer than the touch line TL, connected to the Y-axial electrode line arranged in the right portion of the touch display panel 110.

Since the touch lines TL connected to the X-axial electrode lines and the Y-axial electrode lines disposed in the touch display panel 110 have different lengths, differences in parasitic capacitance among the touch lines TL are formed.

In particular, the portion in FIG. 5, indicated by reference numeral 501, may have a largest level of parasitic capacitance. Thus, touch sensing signals generated by the touch electrodes TE in the portion 501 may have significant differences from touch sensing signals generated by the touch electrodes TE disposed in the other portions. It should be appreciated that the location of portion 501 is an illustrative example specific to the example touch line TL arrangement shown in FIG. 5, which does not limit the scope of the disclosure. Namely, in another touch line TL arrangement, another location may have a largest level of parasitic capacitance.

The touch display device 100 according to example embodiments provides a touch line arrangement structure that can reduce differences in parasitic capacitance among the touch lines TL connecting the touch electrodes TE in the touch display panel 110 to the driver circuit 120.

Figure 6:
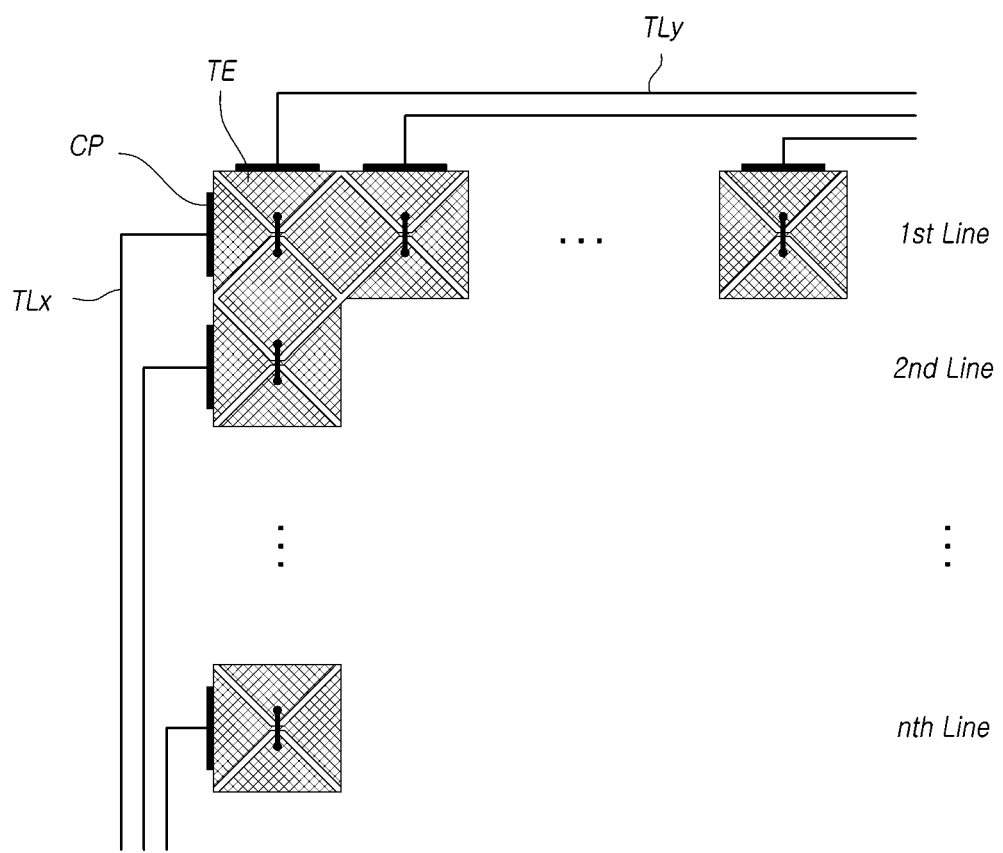
FIG. 6 illustrates an example structure of touch lines and contact pads in the touch display device.

FIG. 6 illustrates an example specific structure in which the touch lines TL are connected to the touch electrodes TE in the touch display device 100 according to example embodiments.

Referring to FIG. 6, in the touch display panel 110, the plurality of touch electrodes TE are arranged in lines.

The touch electrodes TE are connected to the driver circuit 120 through the touch lines TL arranged in the peripheral areas of the touch display panel 110.

Contact pads CP are disposed on portions of the touch electrodes TE to which the touch lines TL are connected, allowing the touch lines TL to be easily connected to the touch electrodes TE.

In the typical arrangement structure of the touch line TL as illustrated in FIG. 6, the touch lines TL connected to the touch electrodes TE arranged in each touch electrode line have the same width.

In addition, the contact pads CP disposed between the touch electrodes TE and the touch lines TL may have the same shape including the same surface area size.

The touch lines TL and the contact pads CP cause parasitic capacitance to be formed in the event of touch sensing. Since the touch lines TL connected to the touch electrodes TE have different lengths, differences in parasitic capacitance are formed among the touch lines TL.

For example, since the touch line TL connected to the touch electrodes TE arranged in the first touch electrode line is longer than the touch line TL connected to the touch electrodes TE arranged in the $n^{th}$ touch electrode line, a difference in parasitic capacitance between the two touch lines TL may be formed. In the same manner, differences in parasitic capacitance between the other touch lines TL may be formed.

In addition, the contact pads CP disposed between the touch electrodes TE and the touch lines TL also have an effect on parasitic capacitance. It is therefore necessary to compensate for the differences in parasitic capacitance depending on the touch lines TL and the contact pads CP connected to the touch electrodes TE.

Figure 7:
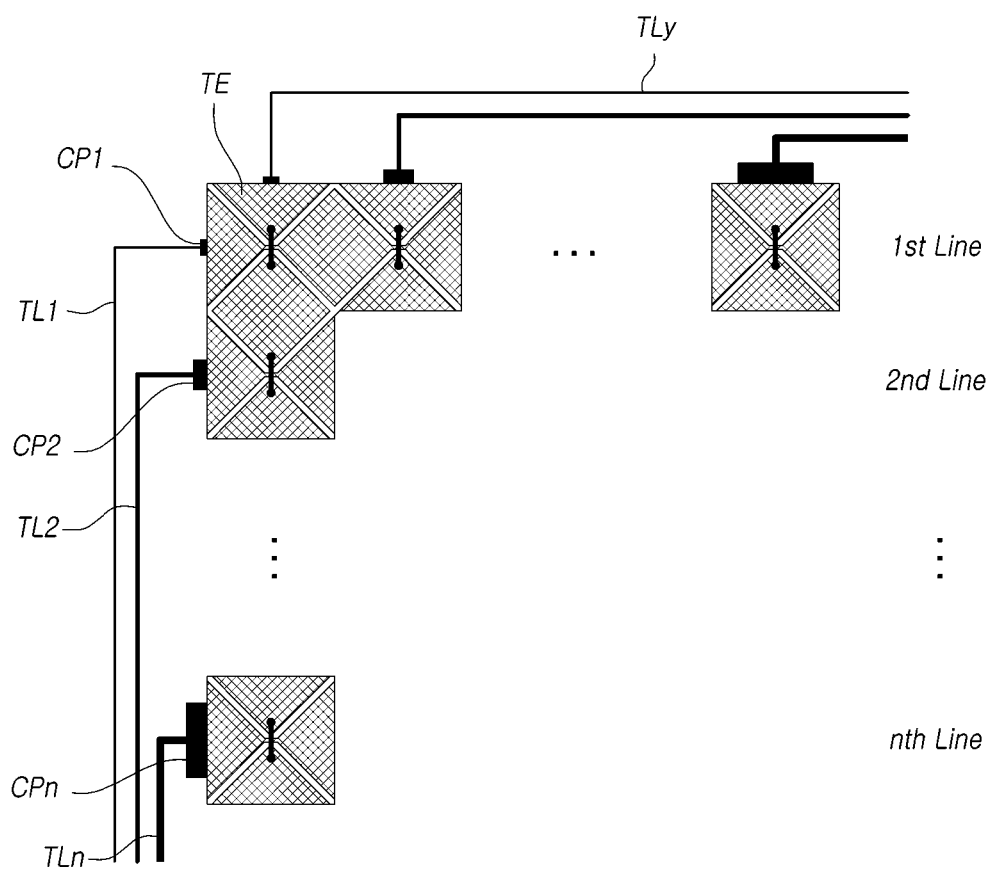
FIG. 7 illustrates a first embodiment of the structure of touch lines and contact pads in the touch display device according to example embodiments.

FIG. 7 illustrates a first embodiment of the structure of the touch lines TL in the touch display device according to example embodiments, the touch line structure being able to compensate for differences in parasitic capacitance according to different lengths of the touch lines TL.

Referring to FIG. 7, in the touch display device 100 according to example embodiments, a plurality of touch electrodes TE are arranged in lines.

Among the touch electrodes TE arranged in each touch electrode line (in the X-axial direction and/or the Y-axial direction), a first touch electrode TE disposed in the outermost position (on either side or both side) is connected to the touch line TL disposed in the peripheral area of the touch display panel 110.

Here, one or more of the widths and lengths of the touch lines TL, connected to the touch electrodes TE arranged in the touch electrode lines, are determined according to the touch electrode lines of the touch electrodes TE to which the touch lines TL are connected.

For example, the touch line TL, connected to the touch electrodes TE arranged in the first touch electrode line, may have a narrower width but a greater length than the touch line TL, connected to the touch electrodes TE arranged in the $n^{th}$ touch electrode line.

That is, the greater the distance between the touch electrode TE and the driver circuit 120 (e.g., determined based on the routing of the touch line TL connecting the touch electrode and the driver circuit 120) is, the narrower in width of the touch line TL is (i.e., the more the width of the touch line TL can be reduced), so that differences in parasitic capacitance caused by the increasing lengths can be compensated for and/or reduced.

The contact pads CP are disposed between the touch electrodes TE, arranged in the touch electrode lines, and the corresponding touch lines TL, respectively.

The contact pads CP may have different shapes including different surface area sizes depending on the positions of the touch electrodes TE (or touch electrode lines) to which the contact pads CP are connected.

Specifically, the contact pads CP are configured such that the surface area (a product of a width and a length) thereof decreases with increases in the distance between the touch electrodes TE, to which the contact pads CP are connected, and the driver circuit 120 (e.g., determined based on the routing of the touch line TL connecting the touch electrode and the driver circuit 120), but increases with decreases in the distance between the touch electrodes TE and the driver circuit 120.

For example, as illustrated in FIG. 7, the area of the first contact pad CP1 connected to the touch electrode TE in the first touch electrode line is smaller than the area of the $n^{th}$ contact pad CPn connected to the touch electrode TE in the $n^{th}$ touch electrode line. The length (and/or width) of the first contact pad CP1 in the row/X-axial direction (or column/Y-axial direction) may be shorter than the length (and/or width) of the $n^{th}$ contact pad CPn in the row (or column) direction, respectively. FIG. 7 shows in more details the touch electrode lines in the X-axial direction and the respective contact pads and touch lines than the touch electrode lines in the Y-axial direction for simplicity. It should be appreciated that the description similarly applies to the touch electrode lines in the Y-axial direction.

The longer the length of the touch line TL connected to the contact pad CP is, the smaller the area of the contact pad CP has. For example, the narrower the width of the touch line TL connected to the contact pad CP is, the smaller the area of the contact pad CP has.

Thus, in the case in which the touch line TL connected to the touch electrode TE is relatively long, the width of the touch line TL and the area of the contact pad CP connected to the touch line TL can be adjusted accordingly. This can consequently compensate for and/or reduce the differences in parasitic capacitance among the touch lines TL depending on the positions of the associated touch electrodes TE.

In addition, in the touch display device 100 according to example embodiments, the touch lines TL and the contact pads CP disposed in the touch display panel 110 are configured such that a total of the area of each touch line TL and the area of the corresponding contact pad CP has a predetermined value, e.g., a same value or a value within a tolerance range about the same value (substantially the same).

For example, a value obtained by adding a product of the width and length (i.e., an area of a touch line surface) of the first touch line TL1, connected to the touch electrode TE in the first touch electrode line, to a product of the length and width (i.e., an area of a contact pad surface) of the first contact pad CP1 is the same as a value obtained by adding a product of the width and length of the second touch line TL2, connected to the touch electrode TE in the second touch electrode line, to a product of the length and width of the second contact pad CP2.

It should be appreciated that for different parasitic capacitance concerns, different surfaces (e.g., different width) of the touch lines TL and/or contact pads CP may be concerns and considered, which are all included in the disclosure. In the description herein, an area is used to refer to a size of a surface area of a touch line TL or a contact pad CP, which could be any and all surfaces of the touch line TL or the contact pad CP that is relevant to parasitic capacitance.

For illustrative example, in the case in which the width and length of the first contact pad CP1 are 10 μm and 100 μm, respectively, and the width and length of the second contact pad CP2 are 15 μm and 200 μm, respectively, the area of the first contact pad CP1 is 1,000 μm$^2$ and the area of the second contact pad CP2 is 3,000 μm$^2$.

Further in the illustrative example, in the case in which the length of the first touch line TL1 is 10,000 μm and the length of the second touch line TL2 is 7,000 μm according to the lengths between the touch electrodes TE and the driver circuit 120, the first touch line TL1 is configured such that the width thereof is 0.9 μm and the second touch line TL2 is configured such that the width thereof is 1.0 μm. Then, the area of the first touch line TL1 is 9,000 μm$^2$ and the area of the second touch line TL2 is 7,000 μm$^2$ Thus, a total of the area 9,000 μm$^2$ of the first touch line TL1 and the area 1,000 μm$^2$ of the first contact pad CP1 (10,000 μm$^2$) is the same as a total of the area 7,000 μm$^2$ of the second touch line TL2 and the area 3,000 μm² of the second contact pad CP2 (10,000 μm²).

This feature can consequently compensate for differences in parasitic capacitance among the touch lines TL connected to the touch electrodes TE disposed in different positions.

In addition, the touch lines TL and the contact pads CP are configured such that a value obtained by adding a product of the width and length of the $n^{th}$ touch line TLn, connected to the touch electrode TE in the $n^{th}$ touch electrode line, to a product of the width and length of the first contact pad CP1, is the same as a value obtained by adding the product of the width and length of the first touch line TL1 to the product of the length and width of the first contact pad CP1.

Since a total of the area of each touch line and the area of the corresponding contact pad connected to the corresponding touch electrode has a predetermined value, e.g., a same value or a value within a tolerance range about the same value (substantially the same), differences in parasitic capacitance depending on the touch electrode lines can be accurately compensated for.

This configuration allowing the total area of a touch line TL and a contact pad CP connected to the touch line TL to be the same as the total area of another touch line TL and another contact pad CP is equally applicable not only to the touch lines TL connected to the touch electrodes TE arranged in the X-axial direction but also to the touch lines TL connected to the touch electrodes TE arranged in the Y-axial direction.

Further, although the illustrative example described herein combines the area of the touch line and the area of the corresponding contact pad together, the disclosure is not limited to this specific example. Various alternative/additional embodiments may be possible and all are included. For example, all the contact pads CP may have a same area and all the touch line may have a same area (with various length and width). For another example, it may not be necessary that for each touch line and the corresponding contact pad, the total area equals a same predetermined value, e.g., a same value or a value within a tolerance range about the same value (substantially the same). Depending on design requirements, it might be acceptable that the difference in total areas or the difference in parasitic capacitances be kept within a certain range. Namely, the total areas of each combination of a contact pad and the corresponding touch line may be within a predetermined range of values (i.e., substantially same).

Further the parasitic capacitances or the areas of the touch line and the contact pad could be considered and design separately and do not necessarily need to be associated to one another. Namely, it is possible that the widths of the touch lines TL vary based at least in part on the different length while the surface area sizes of the corresponding contact pads are the same. It is also possible that the surface area sizes of the contact pads vary based on the different lengths of the corresponding touch lines TL, while the widths of the touch lines are the same. Other various combinations of the design options/choices to design and form the touch line length and/or width and/or the contact pad surface area size for each touch electrode lines are possible and included in the disclosure.

Although the above-described embodiments have been described regarding a case in which the encapsulation layer Encap, disposed below the touch lines TL and the contact pads CP connected to the touch electrodes TE disposed in different positions, has a uniform thickness, the encapsulation layer Encap may have different thicknesses in the regions in which the touch lines TL and the contact pads CP are disposed. The example embodiments provide a structure able to reduce differences in parasitic capacitance in the configuration in which the touch lines TL and the contact pads CP are disposed on the encapsulation layer Encap having different thicknesses.

Figure 8:
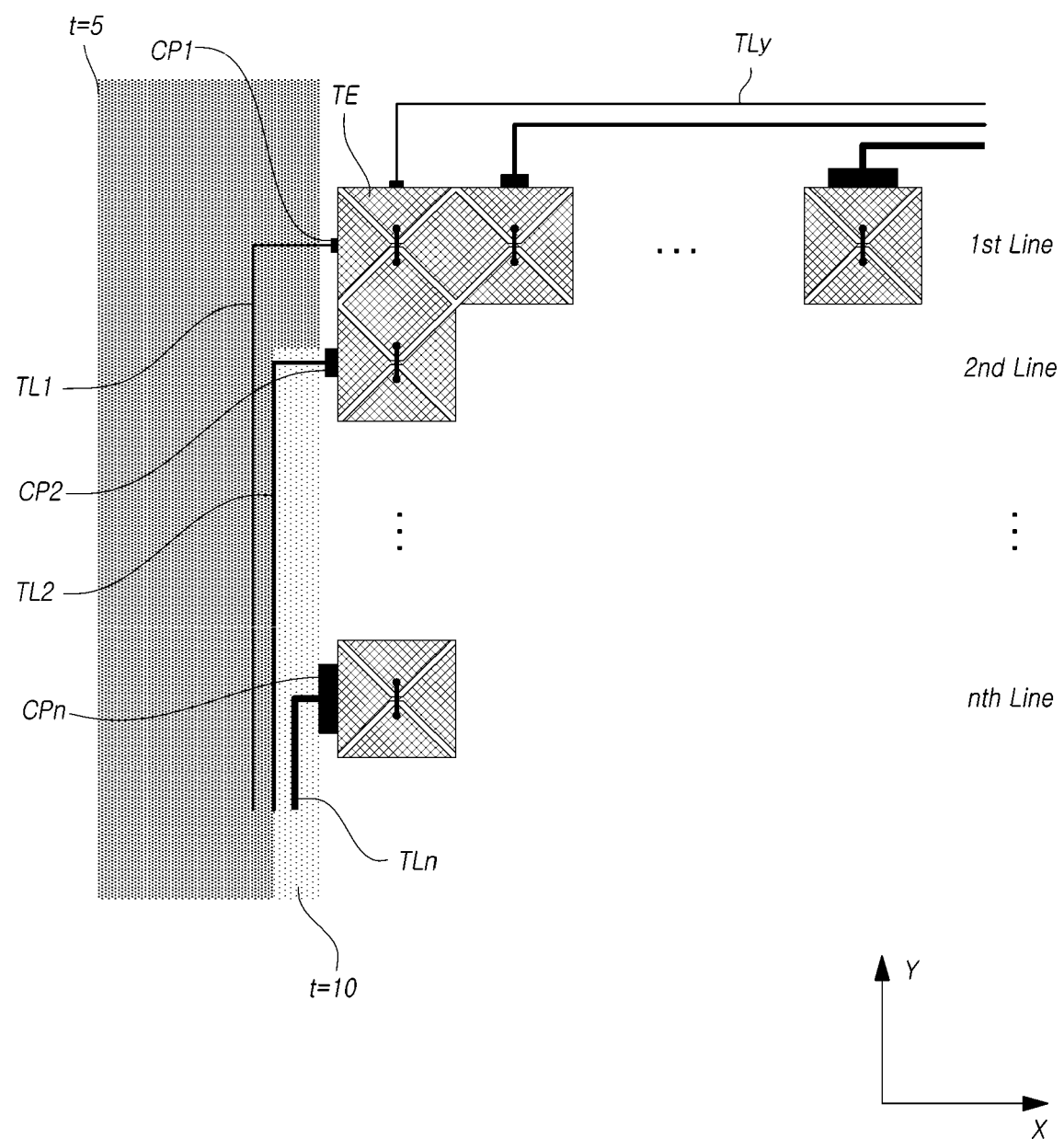
FIG. 8 illustrates a second embodiment of the structure of touch lines and contact pads in the touch display device according to example embodiments.

FIG. 8 illustrates a second embodiment of the structure of the touch lines TL in the touch display device according to example embodiments, the touch line structure being able to reduce differences in parasitic capacitance among the touch lines TL.

Referring to FIG. 8, a plurality of touch electrodes TE are arranged according to touch electrode lines in the touch display panel 110 of the touch display device 100 according to example embodiments.

The plurality of touch electrodes TE are arranged in the X-axial direction and the Y-axial direction. The touch lines TL disposed in the, e.g., left peripheral area of the touch display panel 110 are connected to the plurality of touch electrodes TE (arranged in a plurality of touch electrode lines) arranged in the X-axial direction, while the touch lines TL disposed in, e.g., the right (not shown in FIG. 8) and top peripheral areas of the touch display panel 110 are connected to the plurality of touch electrodes TE (arranged in a plurality of touch electrode lines) arranged in the Y-axial direction.

Using the plurality of touch electrode lines arranged in the X-axial direction as an example, the encapsulation layer Encap disposed below the first touch line TL1 and the first contact pad CP1, connected to the touch electrodes TE arranged in the first touch electrode line among the touch electrodes TE arranged in the X-axial direction, has a first thickness (e.g., 5 μm). The encapsulation layer Encap disposed below the second touch line TL2 and the second contact pad CP2, connected to the touch electrodes TE arranged in the second touch electrode line among the touch electrodes TE arranged in the X-axial direction, has a second thickness (e.g., 10 μm), that is different than the first thickness, e.g., larger thickness value.

In this case, a value obtained by dividing a total of the area of the first touch line TL1 and the area of the first contact pad CP1 with the first thickness of the encapsulation layer Encap disposed below the first touch line TL1 and the first contact pad CP1 is set to be the same as a value obtained by dividing a total of the area of the second touch line TL2 and the area of the second contact pad CP2 with the second thickness of the encapsulation layer Encap disposed below the second touch line TL2 and the second contact pad CP2.

In the case in which the total of the area of the first touch line TL1 and the area of the first contact pad CP1 is designed to be 10,000 μm², which is the same as the total of the area of the second touch line TL2 and the area of the second contact pad CP2, as in the above-described first embodiment, different thicknesses of the encapsulation layer Encap disposed below the touch lines and the contact pads cause different distances to the electrode disposed under the encapsulation layer Encap. This may consequently cause different levels of parasitic capacitance to be formed.

Thus, the width of the touch lines TL and the areas of the contact pads CP are adjusted such that the level of parasitic capacitance formed in the first touch line TL1 and the first contact pad CP1 is the same as the level of parasitic capacitance formed in the second touch line TL2 and the second contact pad CP2.

For example, a case in which the thickness of the encapsulation layer Encap disposed below the first touch line TL1 and the first contact pad CP1 is 5 μm and the thickness of the encapsulation layer Encap disposed below the second touch line TL2 and the second contact pad CP2 is 10 μm will be taken by way of example.

In a case in which the first contact pad CP1 has a width 10 μm and a length 100 μm and the first touch line TL1 has a length 10,000 μm and a width 0.9 μm, the second contact pad CP2 may be designed to have a width 20 μm and a length 300 μm and the second touch line TL2 may be designed to have a width 7,000 μm and a width 2.0 μm.

In this case, a total of the area of the first touch line TL1 and the area of the first contact pad CP1 is 10,000 μm$^2$, while a total of the area of the second touch line TL2 and the area of the second contact pad CP2 is 20,000 μm$^2$.

Thus, a value obtained by dividing the total of the area of the first touch line TL1 and the area of the first contact pad CP1 with the first thickness and a value obtained by dividing the total of the area of the second touch line TL2 and the area of the second contact pad CP2 with the second thickness can be set to be the same.

In addition, the widths of the touch lines TL and the areas of the contact pads CP are adjusted such that a value obtained by dividing a total of the area of the n$^{th}$ touch line TLn and the area of the n$^{th}$ contact pad CPn with the n$^{th}$ thickness of the encapsulation layer Encap disposed below the n$^{th}$ touch line TLn and the n$^{th}$ contact pad CPn is also the same.

In the case in which the first thickness of the encapsulation layer Encap disposed below the first touch line TL1 is smaller than the second thickness of the encapsulation layer Encap disposed below the second touch line TL2, a product of the width and length of the first contact pad CP1 may be smaller than a product of the width and length of the second contact pad CP2.

In addition, in the case in which the width of the first touch line TL1 is narrower than the width of the second touch line TL2, a value obtained by dividing the product of the width and length of the first contact pad CP1 with the first thickness may be smaller than a value obtained by dividing the product of the width and length of the second contact pad CP2 with the second thickness.

In addition, when the first touch line TL1 is longer than the second touch line TL2, a value obtained by dividing the product of the width and length of the first contact pad CP1 with the first thickness may be smaller than a value obtained by dividing the product of the width and length of the second contact pad CP2 with the second thickness.

Since levels of parasitic capacitance in the touch lines TL are inverse proportional to the thicknesses of the touch lines TL, a total of the area of each touch line TL and the area of the corresponding contact pad CP is set to be proportional to the thickness of the encapsulation layer Encap disposed below the touch line TL and the contact pad CP.

Therefore, since a value obtained by dividing a total of the area of each touch line TL and the area of the corresponding contact pad CP with the thickness of the corresponding portion of the encapsulation layer Encap disposed below the touch line TL and the contact pad CP is set to be a predetermined value, e.g., a same value or a value within a tolerance range about the same value (substantially the same), differences in parasitic capacitance among the plurality of touch lines TL can be compensated for.

Similar descriptions also apply to touch lines TL, contact pads CP for the touch electrodes arranged in touch electrode lines in the Y-axial direction and the thickness of the encapsulation layers therebelow.

As set forth above, according to example embodiments, it is possible to compensate for differences in parasitic capacitance among the touch lines TL according to the positions of the touch electrodes TE to which the touch lines TL are connected by configuring the touch lines TL and the contact pads CP disposed between the touch electrodes TE and the driver circuit 120 such that a total of the area of each touch line TL and the area of the corresponding contact pad CP has a predetermined value, e.g., a same value or a value within a tolerance range about the same value (substantially the same).

In addition, in the case in which the encapsulation layer Encap disposed below the touch lines TL has different thicknesses, a value obtained by dividing a total of the area of each touch line TL and the area of the corresponding contact pad CP with the thickness of the corresponding portion of the encapsulation layer Encap is set to be a predetermined value, e.g., a same value or a value within a tolerance range about the same value (substantially the same). Thus, when the encapsulation layer Encap has different thicknesses according to areas in which the touch lines TL are disposed, differences in parasitic capacitance can be compensated for.

It should be appreciated that the thickness of the encapsulation layer Encap, as a factor affecting parasitic capacitance, may also be considered separately than one or more of the area size of the touch line TL a product of a length and a width) and the area size of the contact pad CP. All various combinations of the multiple factors may be considered in the design of the touch lines TL and contact pads CP and/or the encapsulation layer Encap, any and all of which are included in the disclosure.

It is thereby possible to reduce the influence of parasitic capacitance according to the positions of the touch electrodes TE and improve the accuracy of touch sensing by compensating for differences in parasitic capacitance among the touch lines TL.

The foregoing descriptions and the accompanying drawings have been presented in order to explain the certain principles of the present disclosure. A person skilled in the art to which the present disclosure relates could make many modifications and variations by combining, dividing, substituting for, or changing the elements without departing from the principle of the present disclosure. The foregoing embodiments disclosed herein shall be interpreted as illustrative only but not as limitative of the principle and scope of the present disclosure. It should be understood that the scope of the present disclosure shall be defined by the appended Claims and all of their equivalents fall within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A touch display device comprising:
    a first touch electrode line in a first direction in a touch display panel;
    a second touch electrode line in the first direction in the touch display panel;
    a first contact pad connected to an outermost touch electrode of the first touch electrode line;
    a first touch line connected to the first contact pad;
    a second contact pad connected to an outermost touch electrode of the second touch electrode line;
    a second touch line connected to the second contact pad, wherein a value obtained by adding a surface area size of the first contact pad to a surface area size of the first touch line is substantially same as a value obtained by adding a surface area size of the second contact pad to a surface area size of the second touch line; and
    wherein, in a case that a width of the first touch line is narrower than a width of the second touch line, the surface area size of the first contact pad is smaller than the surface area size of the second contact pad.

2. The touch display device of claim 1, wherein, in a case that a length of the first touch line is greater than a length of the second touch line, the surface area size of the first contact pad is smaller than the surface area size of the second contact pad.

3. The touch display device of claim 1, wherein the surface area size of the first contact pad is different from the surface area size of the second contact pad.

4. The touch display device of claim 1, wherein the surface area size of the first touch line is different from the surface area size of the second touch line.

5. The touch display device of claim 1, further comprising:
    an encapsulation layer disposed below the first contact pad, the first touch line, the second contact pad and the second touch line, and
    a cathode layer of at least one organic light emitting diode disposed below the encapsulation layer,
    wherein a thickness of a first portion of the encapsulation layer below the first contact pad and the first touch line is substantially the same as a thickness of a second portion of the encapsulation layer below the second contact pad and the second touch line.

6. A touch display device, comprising:
    a plurality of touch electrodes arranged in touch electrode lines including a first line and a second line in a touch display panel;
    a plurality of contact pads connected to outermost touch electrodes in the touch electrode lines among the plurality of touch electrodes, respectively; and
    a plurality of touch lines connected to the plurality of contact pads, respectively, wherein a surface area size of each of the plurality of contact pads being at least one of proportional to a width of a touch line connected thereto, among the plurality of touch lines and the plurality of contact pads, or inversely proportional to a length of the touch line connected thereto;
    a first contact pad and a second contact pad, the first contact pad coupled to an outermost touch electrode of the first line of touch electrodes and the second contact pad coupled to an outermost touch electrode of the second line of touch electrodes; and
    wherein, in a case that a width of the first touch line is narrower than a width of the second touch line, the surface area size of the first contact pad is smaller than the surface area size of the second contact pad.

7. The touch display device according to claim 6, wherein a value obtained by adding the surface area size of each of the plurality of contact pads and a product of the width and the length of the touch line connected thereto is within a predetermined value range.

8. The touch display device according to claim 6, wherein at least one of a width and a length of each of the plurality of contact pads decrease with a decrease in the width of the touch line connected thereto.

9. The touch display device according to claim 6, wherein at least one of the width and the length of each of the plurality of contact pads decrease with an increase in the length of the touch line connected thereto.

10. The touch display device according to claim 6, wherein the surface area size of each of the plurality of contact pads are different from one another.

11. The touch display device according to claim 6, wherein products of the width and the length of each of the plurality of touch lines are different from one another.

12. A touch display device, comprising:
    a touch display panel including an encapsulation layer;
    a first touch line connected to a first touch electrode among touch electrodes arranged in a first touch electrode line over the encapsulation layer; and
    a second touch line connected to a first touch electrode among touch electrodes arranged in a second touch electrode line over the encapsulation layer, the second touch line being shorter than the first touch line, a first portion of the encapsulation layer below the first touch line having a first thickness, a second portion of the encapsulation layer below the second touch line having a second thickness, the first thickness being smaller than the second thickness, and a value obtained by dividing a total of a product of a width and a length of the first contact pad and a product of a width and a length of the first touch line with the first thickness being substantially the same as a value obtained by dividing a total of a product of a width and a length of the second contact pad and a product of a width and a length of the second touch line with the second thickness.

13. The touch display device according to claim 12, further comprising:
    a first contact pad coupled between the first touch line and the first touch electrode line and a second contact pad coupled between the second touch line and the second touch electrode line, a surface area size of the second contact pad is larger than a surface area size of the first contact pad.

14. The touch display device according to claim 13, wherein, in a case that the width of the first touch line is narrower than the width of the second touch line, a value obtained by dividing the product of the width and length of the first contact pad with the first thickness is larger than a value obtained by dividing the product of the width and length of the second contact pad with the second thickness.

15. The touch display device according to claim 12, wherein, in a case that the length of the first touch line is greater than the length of the second touch line, a value obtained by dividing the product of the width and length of the first contact pad with the first thickness is smaller than a value obtained by dividing the product of the width and length of the second contact pad with the second thickness.

16. A touch display device, comprising:
    a plurality of touch electrodes arranged in a first line and a second line in a same direction; and a first touch line and a second touch line, the first touch line coupled between the first line of touch electrodes and a driver circuit and having a first length, the second touch line coupled between the second line of touch electrode and the driver circuit and having a second different length, a first width of the first touch line being different from a second width of the second touch line;

a first contact pad coupled between the first touch line and the first line of touch electrodes;

a second contact pad coupled between the second touch line and the second line of touch electrodes; and wherein, in a case that a width of the first touch line is narrower than a width of the second touch line, the surface area size of the first contact pad is smaller than the surface area size of the second contact pad.

17. The touch display device of claim 16, wherein a product of the first width and the first length of the first touch line is substantially the same as a product of the second width and the second length of the second touch line.

18. The touch display device of claim 16, wherein a total of a product of the first width and the first length of the first touch line and a surface area size of the first contact pad is substantially the same as a total of a product of the second width and the second length of the second touch line and a surface area size of the second contact pad.

19. A touch display device, comprising:

a plurality of touch electrodes arranged in a first line and a second line in a same direction;

a first contact pad and a second contact pad, the first contact pad coupled to an outermost touch electrode of the first line of touch electrodes and the second contact pad coupled to an outermost touch electrode of the second line of touch electrodes;

a first touch line and a second touch line, the first touch line coupled between the first contact pad and a driver circuit and having a first length, the second touch line coupled between the second contact pad and the driver circuit and having a second different length, at least one of a first surface area size of the first contact pad or a first width of the first touch line being different from a second surface area size of the second contact pad or a second width of the second touch line, respectively, based at least in part on the difference between the first length and the second length.

20. The touch display device according to claim 19, wherein the first length is longer than the second length and the first surface area size of the first contact pad is smaller than the second surface area size of the second contact pad.

21. The touch display device according to claim 19, wherein the first length is longer than the second length and the first width of the first touch line is smaller than the second width of the second touch line.

* * * * *